United States Patent
Chen et al.

(10) Patent No.: US 11,228,308 B2
(45) Date of Patent: Jan. 18, 2022

(54) SWITCHING CIRCUIT

(71) Applicant: RichWave Technology Corp., Taipei (TW)

(72) Inventors: Chih-Sheng Chen, Taipei (TW); Tsung-Han Lee, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/993,218

(22) Filed: Aug. 13, 2020

(65) Prior Publication Data

US 2021/0376823 A1 Dec. 2, 2021

(30) Foreign Application Priority Data

Jun. 2, 2020 (TW) .................. 109118454

(51) Int. Cl.
*H04B 1/04* (2006.01)
*H04B 1/44* (2006.01)
*H03K 17/16* (2006.01)

(52) U.S. Cl.
CPC .......... *H03K 17/16* (2013.01); *H04B 1/0483* (2013.01)

(58) Field of Classification Search
CPC .... H03K 17/102; H03K 17/16; H03K 17/687; H04B 1/006; H04B 1/04; H04B 1/0475; H04B 1/0483; H04B 1/16; H04B 1/40; H04B 1/44; H04B 1/48; H04B 1/50; H04B 3/56; H03H 7/0115; H03H 7/1791; H03H 7/38; H03H 7/463; H03H 9/725
See application file for complete search history.

(56) References Cited

U.S. PATENT DOCUMENTS 6,721,544 B1 4/2004 Franca-Neto
6,998,912 B2 2/2006 Kushitani et al.
(Continued)

FOREIGN PATENT DOCUMENTS

TW 201826698 7/2018

OTHER PUBLICATIONS

"Office Action of Taiwan Counterpart Application", dated Jun. 22, 2021, p. 1-p. 4.
(Continued)

*Primary Examiner* — Quochien B Vuong
(74) *Attorney, Agent, or Firm* — JCIPRNET

(57) ABSTRACT

A switching circuit includes a first transmission terminal, a second transmission terminal, a third transmission terminal, and a variable impedance circuit. The first and the second transmission terminals coupled to a common node form a first transmission path. The third transmission terminal coupled to the common node forms a second transmission path with the first transmission terminal. The variable impedance circuit has a first terminal coupled between the common node and the third transmission terminal, and a second terminal coupled to a first reference potential terminal. When the first transmission path transmits a first signal, a first frequency bandwidth range provided by the variable impedance circuit is determined according to a first frequency of the first signal so that the variable impedance circuit provides low impedance in the first frequency bandwidth range, and the first frequency bandwidth range covers the first frequency.

15 Claims, 3 Drawing Sheets

(56) References Cited

U.S. PATENT DOCUMENTS

| | | | |
|---|---|---|---|
| 8,482,336 B2* | 7/2013 | Sun ................. | H03K 17/693 |
| | | | 327/434 |
| 9,941,582 B2* | 4/2018 | Hayakawa .......... | H04B 1/0057 |
| 10,210,946 B2* | 2/2019 | Samuels ............. | H03K 17/693 |
| 10,461,799 B2* | 10/2019 | Yeh ................... | H04B 1/48 |
| 10,680,574 B1* | 6/2020 | Hrivnak ............. | H04B 1/0458 |
| 10,911,073 B2* | 2/2021 | Schmidhammer ... | H04B 1/0057 |
| 2001/0017576 A1 | 8/2001 | Kondo et al. | |
| 2020/0106471 A1* | 4/2020 | Jang ................... | H04B 1/44 |

OTHER PUBLICATIONS

"Notice of allowance of Taiwan Counterpart Application", dated Oct. 29, 2021, p. 1-p. 3.

* cited by examiner

SWITCHING CIRCUIT

CROSS-REFERENCE TO RELATED APPLICATION

This application claims the priority benefit of Taiwan application serial no. 109118454, filed on Jun. 2, 2020. The entirety of the above-mentioned patent application is hereby incorporated by reference herein and made a part of this specification.

BACKGROUND

Technical Field

The disclosure relates to a circuit, and particularly to a switching circuit.

Description of Related Art

In a conventional switching circuit for transmitting radio frequency signals, generally the switching of different transmission paths for signal transmission is realized by turning on multiple transistor switches. In this regard, the conventional switching circuit usually only isolates the signal energy between different transmission paths with the turned-off transistor switch. However, because the current leakage may occur in the transistor switch, different transmission paths of the conventional switching circuit usually have poor signal isolation. In view of this, several embodiments are proposed as solutions below.

Note that the information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The disclosure provides a switching circuit including a first transmission terminal, a second transmission terminal, a third transmission terminal, and a first variable impedance circuit. The first transmission terminal is coupled to a common node. The second transmission terminal is coupled to the common node and forms a first transmission path with the first transmission terminal. The third transmission terminal is coupled to the common node and forms a second transmission path with the first transmission terminal. The first variable impedance circuit has a first terminal coupled between the common node and the third transmission terminal, and the first variable impedance circuit has a second terminal coupled to a first reference potential terminal. When the first transmission path transmits a first signal, a first frequency bandwidth range provided by the first variable impedance circuit is determined according to a first frequency of the first signal so that the first variable impedance circuit provides low impedance in the first frequency bandwidth range, and the first frequency bandwidth range covers the first frequency.

To make the abovementioned features of the disclosure more comprehensible, embodiments are described in detail below with reference to the accompanying drawings.

DESCRIPTION OF THE EMBODIMENTS

Figure 1:
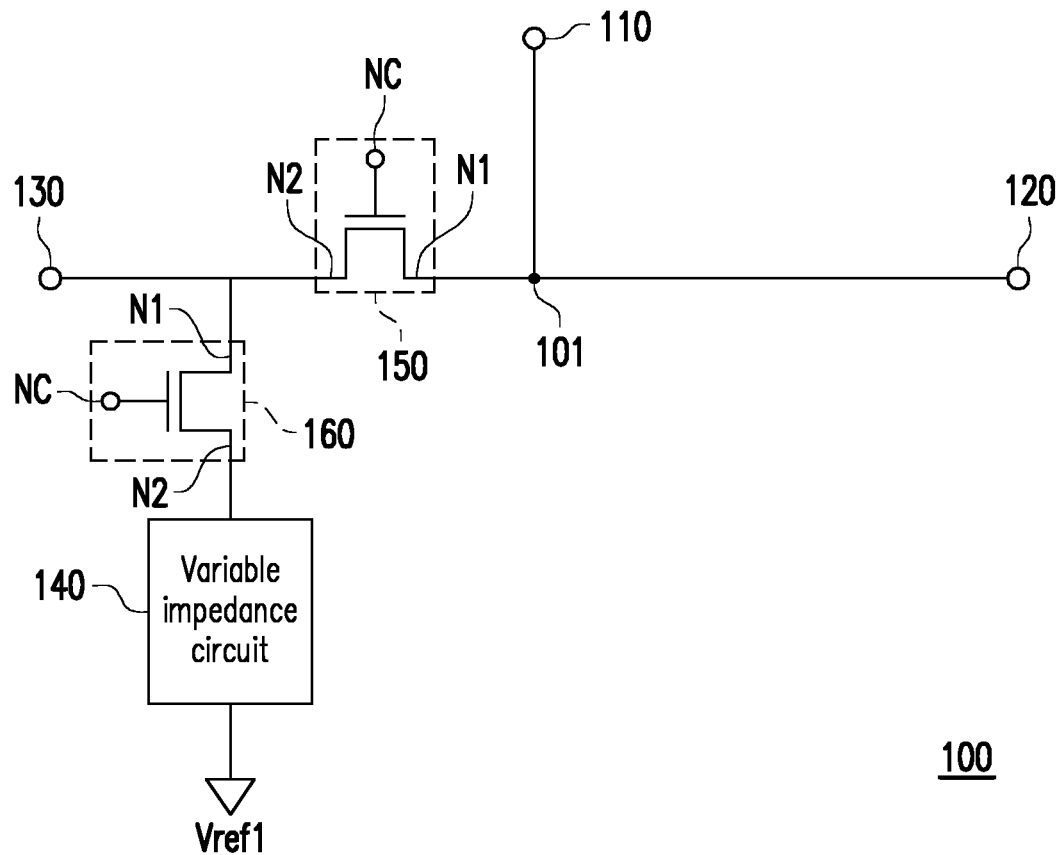
FIG. 1 is a schematic view of a switching circuit according to an embodiment of the disclosure.

The terms "couple/connect" used in this specification (including claims) may refer to any direct or indirect connection means. For example, "a first device is coupled (or connected) to a second device" should be interpreted as "the first device is directly connected to the second device" or "the first device is indirectly connected to the second device through other devices or connection means." The terms "first", "second", and so on used in this specification (including claims) are used to name the elements or distinguish different embodiments or ranges from each other, and should not be construed as the upper limit or lower limit of the number of the elements or as a limitation to the order of the elements. Moreover, wherever appropriate in the drawings and embodiments, elements/components/steps with the same reference numerals represent the same or similar parts. Elements/components/steps with the same reference numerals or names in different embodiments may be cross-referenced.

The disclosure provides a switching circuit capable of providing a plurality of transmission terminals and a plurality of transmission paths to switch and transmit signals of different frequencies, and the switching circuit has good signal transmission quality between different transmission paths. FIG. 1 is a schematic view of a switching circuit according to an embodiment of the disclosure. Referring to FIG. 1, a switching circuit 100 may be applied to switch the transmission paths of radio frequency (RF) signals in different frequency bands, for example, but the disclosure is not limited thereto. In the present embodiment, the switching circuit 100 includes transmission terminals 110, 120, and 130; a variable impedance circuit 140; and transistors 150 and 160. The transmission terminals 110 and 120 are respectively coupled to a common node 101, and the transmission terminal 130 is coupled to the common node 101 via the transistor 150. The variable impedance circuit 140 is coupled to the transmission terminal 130 via the transistor 160. The transistor 150 has a first terminal N1 coupled to the common node 101, and a second terminal N2 coupled to the transmission terminal 130. The transistor 160 has a first terminal N1 coupled to the second terminal N2 of the transistor 150, and a second terminal N2 coupled to the variable impedance circuit 140. The variable impedance circuit 140 has a first terminal coupled to the second terminal N2 of the transistor 160, and a second terminal coupled to a reference potential terminal Vref1.

In the present embodiment, a first transmission path may be formed between the transmission terminals 110 and 120, and a second transmission path is formed between the transmission terminals 110 and 130. For example, the transmission terminal 110 may be coupled to an antenna to serve as a signal transmitter (TX) or a signal receiver (RX), and the transmission terminals 120 and 130, for example, may be respectively coupled to different back-end signal processing circuits to serve as the signal receiver or the signal transmitter. The antenna may operate in a band, for example, 3G, 4G, 5G, Wi-Fi, or the like, and the disclosure is not limited thereto. When the transmission terminal 110 receives a signal to output to the back-end signal processing circuit via the transmission terminal 120, control terminals NC of the transistor 150 and the transistor 160 receive control signals respectively so that the transistor 150 is turned off, and the transistor 160 is turned on to prevent the signal energy of the signal from being leaked to the transmission terminal 130. Also, the variable impedance circuit 140 can serve as a release path for the leaked signal energy. In this regard, the variable impedance circuit 140 may correspondingly adjust the impedance according to the frequency of the signal so that the variable impedance circuit 140 provides lower impedance in a frequency bandwidth range, and the frequency bandwidth range covers the frequency of the signal. For example, the impedance in the frequency bandwidth range provided by the variable impedance circuit 140 may be lower than the impedance of the second transmission path. Therefore, the leaked signal energy is directed to the variable impedance circuit 140 to effectively reduce or prevent the leaked signal energy from being transmitted to the transmission terminal 130.

In other words, the switching circuit 100 not only prevents the signal from being transmitted to the transmission terminal 130 by turning off the transistor 150 but also adjusts the frequency bandwidth range of the variable impedance circuit 140 according to the frequency of the currently transmitted signal so that the variable impedance circuit 140 provides lower impedance according to the frequency of the signal. Therefore, in the transmission of a signal via the first transmission path, if part of the energy of the signal is leaked to the second terminal N2 of the transistor 150, the variable impedance circuit 140 may release the energy leaked to the second terminal N2 of the transistor 150 to the reference potential terminal Vref1. Therefore, in the present embodiment, the first transmission path and the second transmission path of the switching circuit 100 have good signal isolation. Note that the transmission terminals 110, 120, and 130 of the switching circuit 100 in the disclosure are not limited to the aforementioned signal transmission directions, and the transistors 150 and 160 may be P-type semiconductors or N-type semiconductors. The disclosure is not limited thereto. In addition, the specific implementation of the variable impedance circuit 140 will be described in detail with reference to the embodiments of FIGS. 2A to 2C below.

Figure 2A:
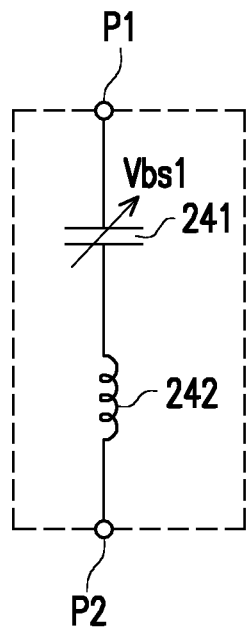
FIG. 2A is a schematic view of a variable impedance circuit according to the first embodiment of the disclosure.

FIG. 2A is a schematic view of a variable impedance circuit according to the first embodiment of the disclosure. Referring to FIG. 1 and FIG. 2A, the variable impedance circuit 140 may include, for example, a variable capacitor 241 and an inductor 242. A first terminal of the variable capacitor 241 is coupled to a first terminal P1 of the variable impedance circuit 140, and a second terminal of the variable capacitor 241 is coupled to a first terminal of the inductor 242. A second terminal of the inductor 242 is coupled to a second terminal P2 of the variable impedance circuit 140. In the present embodiment, the variable capacitor 241 and the inductor 242 constitute a series resonance circuit, and the variable capacitor 241 determines the capacitance value according to a control voltage Vbs1. The control voltage Vbs1 is determined according to the frequency of the signal transmitted between the transmission terminals 110 and 120. Therefore, when a signal is transmitted between the transmission terminals 110 and 120 of the switching circuit 100 of FIG. 1, the variable impedance circuit 140 can adjust the capacitance value of the variable capacitor 241 via the control voltage Vbs1 to correspondingly adjust the series resonance frequency so that the variable impedance circuit 140 can provide lower impedance in the frequency bandwidth range corresponding to the frequency of the signal. In addition, in another embodiment, a capacitor with a fixed capacitance value may be additionally connected in series between the variable capacitor 241 and the inductor 242.

Figure 2B:
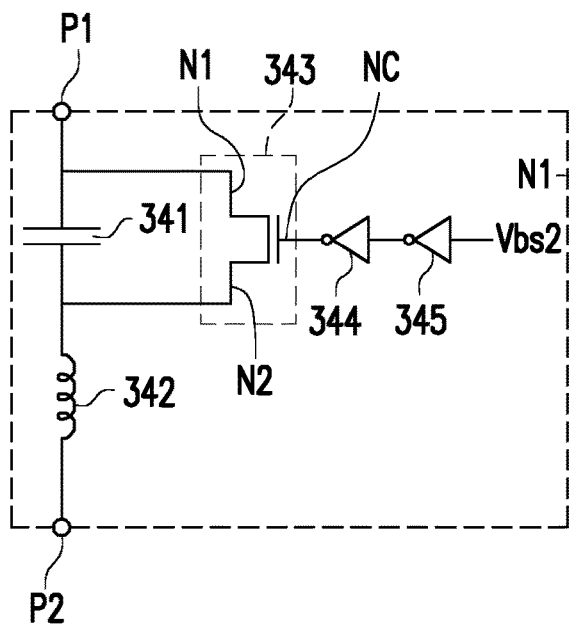
FIG. 2B is a schematic view of a variable impedance circuit according to the second embodiment of the disclosure.

FIG. 2B is a schematic view of a variable impedance circuit according to the second embodiment of the disclosure. Referring to FIG. 1 and FIG. 2B, the variable impedance circuit 140 may include, for example, a capacitor 341, an inductor 342, a transistor 343, and inverters 344 and 345. A first terminal of the capacitor 341 is coupled to the first terminal P1 of the variable impedance circuit 140, and a second terminal of the capacitor 341 is coupled to a first terminal of the inductor 342. A second terminal of the inductor 342 is coupled to the second terminal P2 of the variable impedance circuit 140. In the present embodiment, the capacitor 341 and the inductor 342 constitute a series resonance circuit. A first terminal N1 of the transistor 343 is coupled to the first terminal P1 of the variable impedance circuit 140, and a second terminal N2 of the transistor 343 is coupled to the second terminal of the capacitor 341. A control terminal NC of the transistor 343 is coupled to an output terminal of the inverter 344, and an input terminal of the inverter 344 is coupled to an output terminal of the inverter 345. An input terminal of the inverter 345 receives a control voltage Vbs2. In the present embodiment, the transistor 343 may be a P-type semiconductor or an N-type semiconductor, and the disclosure is not limited thereto.

In the present embodiment, the control voltage Vbs2 may determine the conduction degree of the transistor 343 to correspondingly change the equivalent capacitance value of the capacitor 341. The control voltage Vbs2 is determined according to the frequency of the signal transmitted between the transmission terminals 110 and 120. Therefore, when a signal is transmitted between the transmission terminals 110 and 120 of the switching circuit 100 of FIG. 1, the variable impedance circuit 140 can adjust the equivalent capacitance value of the capacitor 341 via the control voltage Vbs2 to correspondingly adjust the series resonance frequency so that the variable impedance circuit 140 can provide lower impedance in the frequency bandwidth range corresponding to the frequency of the signal.

However, in another embodiment, the control voltage Vbs2 can also only be used to control on or off of the transistor 343, and the first system voltage and the second system voltage respectively received by the power terminals (not shown) of the inverters 344 and 345 can be determined according to the frequency of the signal transmitted between the transmission terminals 110 and 120 to correspondingly adjust the control voltage Vbs2 input to the control terminal NC of the transistor 343 via the inverters 344 and 345. In addition, a capacitor with a fixed capacitance value may be additionally connected in series between the capacitor 341 and the inductor 342.

Figure 2C:
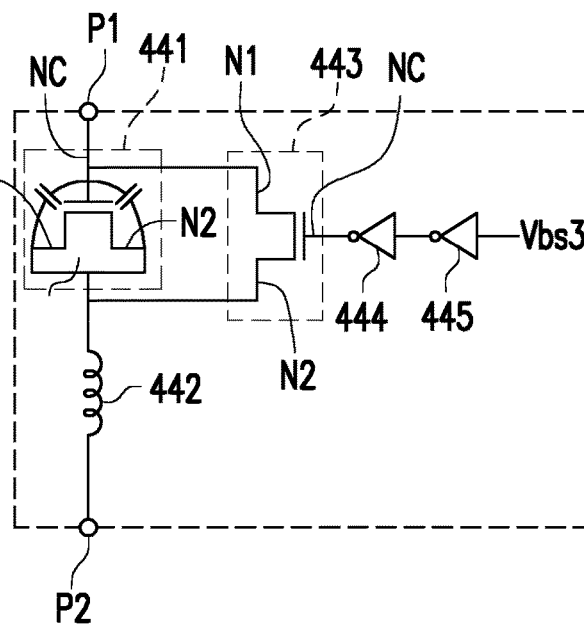
FIG. 2C is a schematic view of a variable impedance circuit according to the third embodiment of the disclosure.

FIG. 2C is a schematic view of a variable impedance circuit according to the third embodiment of the disclosure. Referring to FIG. 1 and FIG. 2C, the variable impedance circuit 140 may include, for example, a transistor capacitor 441, an inductor 442, a transistor 443, and inverters 444 and 445. A control terminal NC of the transistor capacitor 441 is coupled to the first terminal P1 of the variable impedance circuit 140, and a first terminal N1 and a second terminal N2 of the transistor capacitor 441 are coupled to a first terminal of the inductor 442. A second terminal of the inductor 442 is coupled to the second terminal P2 of the variable impedance circuit 140. In the present embodiment, the transistor capacitor 441 and the inductor 442 constitute a series resonance circuit. A first terminal N1 of the transistor 443 is coupled to the first terminal P1 of the variable impedance circuit 140, and a second terminal N2 of the transistor 443 is coupled to the first terminal N1 and the second terminal N2 of the transistor capacitor 441. A control terminal NC of the transistor 443 is coupled to an output terminal of the inverter 444, and an input terminal of the inverter 444 is coupled to an output terminal of the inverter 445. An input terminal of the inverter 445 receives a control voltage Vbs3. In the present embodiment, the transistor 443 may be a P-type semiconductor or an N-type semiconductor, and the disclosure is not limited thereto.

In the present embodiment, the control voltage Vbs3 may determine the conduction degree of the transistor 443 to correspondingly change the equivalent capacitance value of the transistor capacitor 441. The control voltage Vbs3 is determined according to the frequency of the signal transmitted between the transmission terminals 110 and 120. Therefore, when a signal is transmitted between the transmission terminals 110 and 120 of the switching circuit 100 of FIG. 1, the variable impedance circuit 140 can adjust the equivalent capacitance value of the capacitor 441 via the control voltage Vbs3 to correspondingly adjust the series resonance frequency so that the variable impedance circuit 140 can provide lower impedance in the frequency bandwidth range corresponding to the frequency of the signal.

However, in another embodiment, the control voltage Vbs3 can also only be used to control on or off of the transistor 443, and the first system voltage and the second system voltage received respectively by the power terminals (not shown) of the inverters 444 and 445 can be determined according to the frequency of the signal transmitted between the transmission terminals 110 and 120 to correspondingly adjust the control voltage Vbs3 input to the control terminal NC of the transistor 443 via the inverters 444 and 445. In addition, a capacitor with a fixed capacitance value may be additionally connected in series between the transistor capacitor 441 and the inductor 442.

Figure 3:
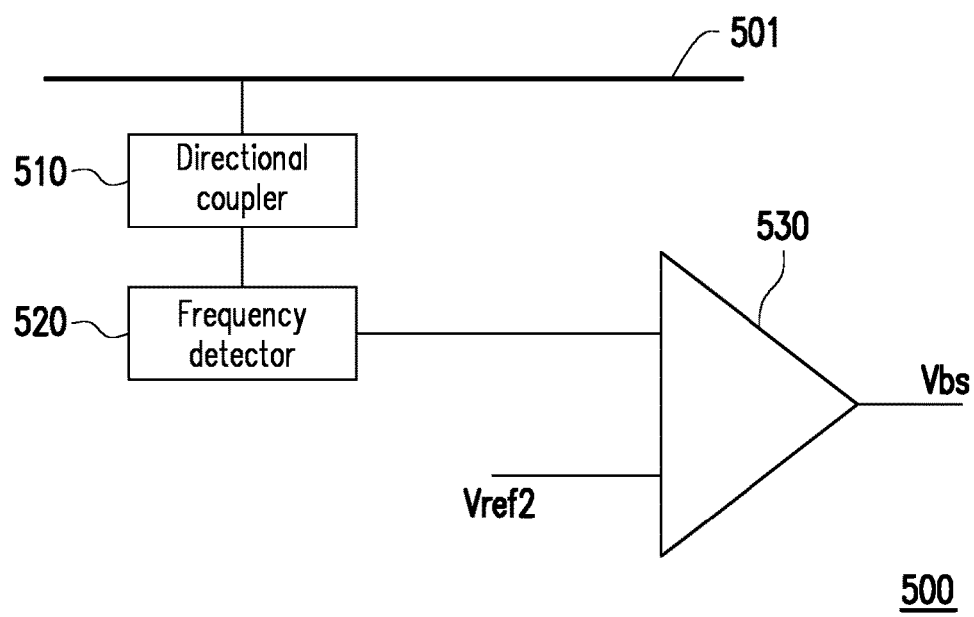
FIG. 3 is a schematic view of a control voltage generating circuit according to an embodiment of the disclosure.

FIG. 3 is a schematic view of a control voltage generating circuit according to an embodiment of the disclosure. Referring to FIG. 3, a control voltage generating circuit 500 of FIG. 3 may be adapted to generate the control voltages Vbs1, Vbs2, and Vbs3 in the embodiments of FIGS. 2A to 2C. In the present embodiment, the control voltage generating circuit 500 includes a directional coupler 510, a frequency detector 520, and a comparator 530. The directional coupler 510 is coupled to a transmission path 501. The transmission path 501 may be, for example, the first transmission path between the transmission terminal 110 and the transmission terminal 120 in the embodiment of FIG. 1. The frequency detector 520 is coupled to the directional coupler 510. A first input terminal of the comparator 530 is coupled to the frequency detector 520, and a second input terminal of the comparator 530 is coupled to a reference potential terminal Vref2. An output terminal of the comparator 530 outputs a control voltage Vbs. The voltage of the reference potential terminal Vref2 can be designed corresponding to the frequency of the signal transmitted via the transmission path 501. When the transmission path 501 transmits a signal, the frequency detector 520 detects the frequency of the signal to generate a voltage, and the comparator 530 compares the voltage to the voltage of the reference potential terminal Vref2 to generate the control voltage Vbs. Therefore, the control voltage Vbs is effectively generated corresponding to the signal transmitted via the transmission path 501. In another embodiment, the directional coupler 510 and/or the comparator 530 could be omitted. The frequency detector 520 is coupled to the transmission path 501, and when the first transmission path 501 transmits the signal, the frequency detector 520 detects the frequency of the signal to generate a detecting signal, and the control voltage Vbs is generated according to the detecting signal.

Figure 4:
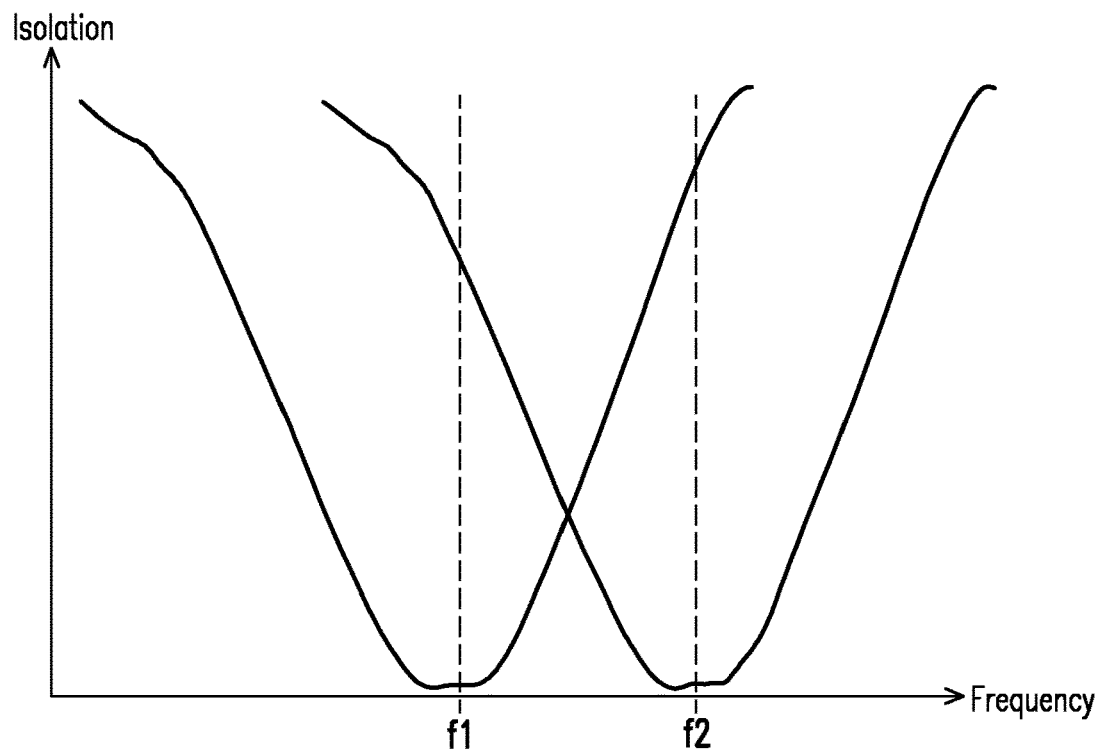
FIG. 4 is a schematic view of bandwidth adjustment according to an embodiment of the disclosure.

FIG. 4 is a schematic view of bandwidth adjustment according to an embodiment of the disclosure. Referring to FIG. 1, FIG. 2A, FIG. 3, and FIG. 4, as shown in FIG. 1, when a signal with a frequency f1 is transmitted between the transmission terminals 110 and 120, the transistor 150 is turned off, the transistor 160 is turned on, and the variable impedance circuit 140 can adjust the impedance correspondingly according to the frequency of the signal transmitted between the transmission terminals 110 and 120. In detail, as shown in FIG. 3, the control voltage generating circuit 500 generates the control voltage Vbs according to the signal transmitted via the transmission path 501 so that the variable capacitor 241 of FIG. 2A determines the capacitance value according to the control voltage Vbs. The series resonance frequency of the variable impedance circuit 140 can be adjusted to the frequency f1 so that the variable impedance circuit 140 can provide lower impedance in the frequency bandwidth range corresponding to the frequency f1. Therefore, the signal isolation between the first transmission path and the second transmission path of the switching circuit 100 may change correspondingly as the curve of the frequency f1 shown in FIG. 4. The first transmission path and the second transmission path of the switching circuit 100 have good signal isolation for the signal with the frequency f1.

Then, when the transmission terminals 110 and 120 are switched to transmit another signal with a frequency f2, the transistor 150 is turned off, the transistor 160 is turned on, and the variable impedance circuit 140 can adjust the impedance correspondingly according to the frequency of the signal transmitted between the transmission terminals 110 and 120. In detail, as shown in FIG. 3, the control voltage generating circuit 500 can adjust the control voltage Vbs according to the another signal transmitted via the transmission path 501 so that the variable capacitor 241 of FIG. 2A can change the capacitance value according to the control voltage Vbs. The series resonance frequency of the variable impedance circuit 140 can be adjusted to the frequency f2 so that the variable impedance circuit 140 can also provide lower impedance in the frequency bandwidth range corresponding to the frequency f2. Therefore, the signal isolation between the first transmission path and the second transmission path of the switching circuit 100 may change as the curve corresponding to the frequency f2 shown in FIG. 4. The first transmission path and the second transmission path of the switching circuit 100 also have good signal isolation for the signal with the frequency f2.

In other words, the switching circuit 100 in the present embodiment dynamically adjusts the impedance of the variable impedance circuit 140 according to the frequency of the currently transmitted signal. When the switching circuit 100 is switched to transmit signals in different frequency bands, good signal isolation is maintained between different transmission paths of the switching circuit 100. In addition, in another embodiment, the variable impedance circuit 140 of the switching circuit 100 may also adopt the manner as shown in FIG. 2B or 2C to achieve the effect of dynamically adjusting the impedance as shown in FIG. 2A, and the description is not repeated here.

Figure 5:
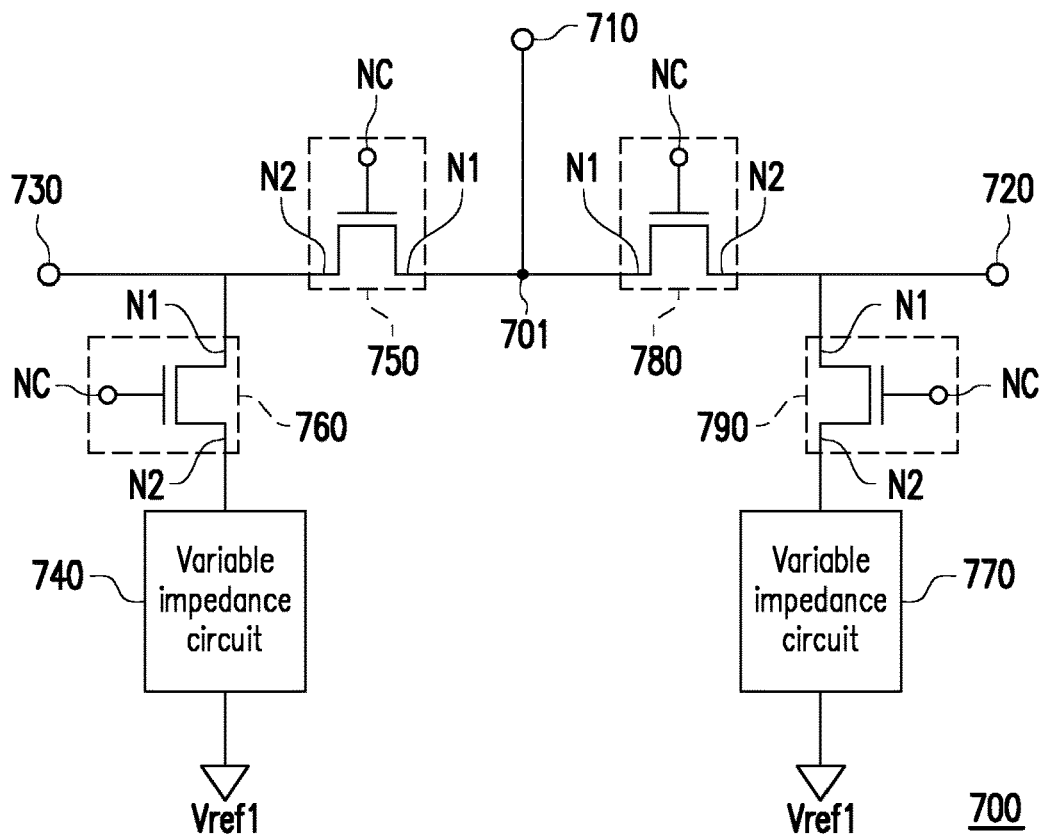
FIG. 5 is a schematic view of a switching circuit according to another embodiment of the disclosure.

FIG. 5 is a schematic view of a switching circuit according to another embodiment of the disclosure. Referring to FIG. 5, a switching circuit 700 includes transmission terminals 710, 720, and 730; variable impedance circuits 740 and 770; and transistors 750, 760, 780, and 790. The transmission terminal 710 is coupled to a common node 701. The transmission terminal 720 is coupled to the common node 701 via the transistor 780, and the transmission terminal 730 is coupled to the common node 701 via the transistor 750. The variable impedance circuit 740 is coupled to the transmission terminal 730 via the transistor 760, and the variable impedance circuit 770 is coupled to the transmission terminal 720 via the transistor 790. The transistor 750 has a first terminal N1 coupled to the common node 701, and has a second terminal N2 coupled to the transmission terminal 730. The transistor 760 has a first terminal N1 coupled to the second terminal N2 of the transistor 750, and a second terminal N2 coupled to the variable impedance circuit 740. The transistor 780 has a first terminal N1 coupled to the common node 701, and a second terminal N2 coupled to the transmission terminal 720. The transistor 790 has a first terminal N1 coupled to the second terminal N2 of the transistor 780, and a second terminal N2 coupled to the variable impedance circuit 770. The variable impedance circuit 740 has a first terminal coupled to the second terminal of the transistor 760, and a second terminal N2 coupled to the reference potential terminal Vref1. The variable impedance circuit 770 has a first terminal coupled to the second terminal N2 of the transistor 790, and a second terminal coupled to the reference potential terminal Vref1.

In the present embodiment, a first transmission path may be formed between the transmission terminals 710 and 720, and a second transmission path is formed between the transmission terminals 710 and 730. For example, the transmission terminal 710 may be coupled to an antenna to serve as a signal transmitter or a signal receiver, and the transmission terminals 720 and 730, for example, may be respectively coupled to different back-end signal processing circuits to serve as a signal receiver or a signal transmitter. When the transmission terminal 710 receives a first signal to be output to the back-end signal processing circuit via the transmission terminal 720, the transistors 750 and 790 are turned off, and the transistors 760 and 780 are turned on to transmit the first signal to the transmission terminal 720, so as to prevent the signal energy of the first signal from being leaked to the transmission terminal 730. Also, the variable impedance circuit 740 can serve as a transmission circuit for the leaked signal energy. In this regard, the variable impedance circuit 740 may adjust the impedance correspondingly according to the frequency of the signal so that the variable impedance circuit 740 provides lower impedance in a first frequency bandwidth range, and the first frequency bandwidth range covers the first frequency of the signal. Therefore, the leaked signal energy is released via the variable impedance circuit 740 to effectively reduce or prevent the leaked signal energy from being transmitted to the transmission terminal 730.

Similarly, when the transmission terminal 710 receives a second signal to be output to the back-end signal processing circuit via the transmission terminal 730, the transistors 760 and 780 are turned off, and the transistors 750 and 790 are turned on to transmit the second signal to the transmission terminal 730, so as to prevent the signal energy of the second signal from being leaked to the transmission terminal 720. Also, the variable impedance circuit 770 can serve as a transmission circuit for the leaked signal energy. In this regard, the variable impedance circuit 770 may adjust the impedance correspondingly according to the frequency of the signal so that the variable impedance circuit 770 provides lower impedance in a second frequency bandwidth range, and the second frequency bandwidth range covers the second frequency of the signal. Therefore, the leaked signal energy is released via the variable impedance circuit 770 to effectively reduce or prevent the leaked signal energy from being transmitted to the transmission terminal 720.

Therefore, compared to the switching circuit 100 of FIG. 1, the switching circuit 700 may be coupled to the variable impedance circuits 740 and 770 respectively on the first transmission path and the second transmission path. Therefore, in the transmission of the first signal via the first transmission path, if part of the energy of the first signal is leaked to the second terminal N2 of the transistor 750, the variable impedance circuit 740 may release the energy leaked to the second terminal N2 of the transistor 750 to the reference potential terminal Vref1. In the transmission of the second signal via the second transmission path, if part of the energy of the second signal is leaked to the second terminal N2 of the transistor 780, the variable impedance circuit 770 may release the energy leaked to the second terminal N2 of the transistor 780 to the reference potential terminal Vref1. Therefore, in the present embodiment, the first transmission path and the second transmission path of the switching circuit 700 have good signal isolation. Note that the transmission terminals 710, 720, and 730 of the switching circuit 700 in the disclosure are not limited to the aforementioned signal transmission directions, and the transistors 750, 760, 780, and 790 may be P-type semiconductors or N-type semiconductors. Nevertheless, the disclosure is not limited thereto.

Moreover, specific implementations, circuit features, and technical efficacy about the switching circuit 700 and the variable impedance circuits 740 and 770 can be understood by referring to the teachings, suggestions, and implementations of the embodiments of FIGS. 1 to 4, and therefore, are omitted herein.

Based on the above, in the transmission of a signal via one of the two transmission paths, the switching circuit of the disclosure adjusts the impedance corresponding to the frequency of the signal via the variable impedance circuit coupled to the other of the two transmission paths to effectively release the energy of the signal leaked to the other of the two transmission paths to the reference potential terminal. Thus, in the switching and transmission of signals in different frequency bands, good signal isolation is maintained between the two transmission paths.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:
1. A switching circuit, comprising:
 a first transmission terminal coupled to a common node;
 a second transmission terminal coupled to the common node and forming a first transmission path with the first transmission terminal;

a third transmission terminal coupled to the common node and forming a second transmission path with the first transmission terminal; and a first variable impedance circuit comprising a first terminal coupled between the common node and the third transmission terminal, and a second terminal coupled to a first reference potential terminal, wherein when the first transmission path transmits a first signal, a first frequency bandwidth range provided by the first variable impedance circuit is determined according to a first frequency of the first signal so that the first variable impedance circuit provides low impedance in the first frequency bandwidth range, and the first frequency bandwidth range covers the first frequency.

2. The switching circuit of claim 1, further comprising:
a first transistor comprising a first terminal coupled to the common node, and a second terminal coupled to the third transmission terminal; and
a second transistor comprising a first terminal coupled to the second terminal of the first transistor, and a second terminal coupled to the first variable impedance circuit,
wherein when the first transmission path transmits the first signal, the first transistor is turned off and the second transistor is turned on.

3. The switching circuit of claim 1, wherein the first variable impedance circuit comprises:
a variable capacitor comprising a first terminal coupled to the first terminal of the first variable impedance circuit for determining a capacitance value according to a first control voltage; and
an inductor comprising a first terminal coupled to a second terminal of the variable capacitor, and a second terminal coupled to the second terminal of the first variable impedance circuit.

4. The switching circuit of claim 3, further comprising:
a directional coupler coupled to the first transmission path;
a frequency detector coupled to the directional coupler; and
a comparator comprising a first input terminal coupled to the frequency detector, a second input terminal coupled to a second reference potential terminal, and an output terminal,
wherein when the first transmission path transmits the first signal, the frequency detector detects the first frequency of the first signal to generate a first voltage, and the comparator compares the first voltage to the second reference potential terminal to generate the first control voltage.

5. The switching circuit of claim 3, further comprising:
a frequency detector coupled to the first transmission path; and
wherein when the first transmission path transmits the first signal, the frequency detector detects the first frequency of the first signal to generate a first detecting signal, and the first control voltage is generated according to the first detecting signal.

6. The switching circuit of claim 3, wherein a capacitor is connected in series between the variable capacitor and the inductor.

7. The switching circuit of claim 1, wherein the first variable impedance circuit comprises:
a capacitor comprising a first terminal coupled to the first terminal of the first variable impedance circuit;
a third transistor comprising a first terminal coupled to the first terminal of the first variable impedance circuit; and an inductor comprising a first terminal coupled to a second terminal of the capacitor and a second terminal of the third transistor, and a second terminal coupled to the second terminal of the first variable impedance circuit, wherein the capacitor and the third transistor are connected in parallel, and a second control voltage received by a control terminal of the third transistor is determined according to the first frequency of the first signal.

8. The switching circuit of claim 7, wherein the first variable impedance circuit further comprises:
a first inverter comprising an output terminal coupled to the control terminal of the third transistor for outputting the second control voltage; and
a second inverter comprising an output terminal coupled to an input terminal of the first inverter.

9. The switching circuit of claim 8, wherein the second inverter further comprises an input terminal for receiving a third control voltage, and the third control voltage is determined according to the first frequency of the first signal.

10. The switching circuit of claim 8, wherein the first inverter and the second inverter further respectively comprise a power terminal for respectively receiving a first system voltage and a second system voltage, and the first system voltage and the second system voltage are determined according to the first frequency of the first signal.

11. The switching circuit of claim 1, wherein the first variable impedance circuit comprises:
a transistor capacitor comprising a control terminal coupled to the first terminal of the first variable impedance circuit;
a third transistor comprising a first terminal coupled to the first terminal of the first variable impedance circuit; and
an inductor comprising a first terminal coupled to a first terminal and a second terminal of the transistor capacitor and a second terminal of the third transistor, and a second terminal coupled to the second terminal of the first variable impedance circuit,
wherein the transistor capacitor and the third transistor are connected in parallel, and a second control voltage received by a control terminal of the third transistor is determined according to the first frequency of the first signal.

12. The switching circuit of claim 11, wherein the first variable impedance circuit further comprises:
a first inverter comprising an output terminal coupled to the control terminal of the third transistor for outputting the second control voltage; and
a second inverter comprising an output terminal coupled to an input terminal of the first inverter.

13. The switching circuit of claim 1, wherein when the first transmission path is switched to transmit a second signal, the first frequency bandwidth range provided by the first variable impedance circuit changes according to a second frequency of the second signal so that the first frequency bandwidth range covers the second frequency.

14. The switching circuit of claim 13, further comprising:
a fourth transistor comprising a first terminal coupled to the common node, and a second terminal coupled to the second transmission terminal; and
a fifth transistor comprising a first terminal coupled to the second terminal of the fourth transistor, and a second terminal coupled to the second variable impedance circuit, wherein when the second transmission path transmits the second signal, the fourth transistor is turned off, and the fifth transistor is turned on.

15. The switching circuit of claim 1, further comprising:
a second variable impedance circuit comprising a first terminal coupled between the common node and the second transmission terminal, and a second terminal coupled to the first reference potential terminal, wherein when an antenna switching circuit is switched to transmit a second signal via the second transmission path, a second frequency bandwidth range provided by the second variable impedance circuit is determined according to a second frequency of the second signal so that the second variable impedance circuit provides low impedance in the second frequency bandwidth range, and the second frequency bandwidth range covers the second frequency.

* * * * *